United States Patent
Koemtzopoulos et al.

(10) Patent No.: US 6,303,044 B1
(45) Date of Patent: Oct. 16, 2001

(54) METHOD OF AND APPARATUS FOR DETECTING AND CONTROLLING IN SITU CLEANING TIME OF VACUUM PROCESSING CHAMBERS

(75) Inventors: C. Robert Koemtzopoulos, Hayward; Felix Kozakevich, Sunnyvale, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/413,871

(22) Filed: Oct. 7, 1999

Related U.S. Application Data

(62) Division of application No. 08/829,674, filed on Mar. 31, 1997, now Pat. No. 6,017,414.

(51) Int. Cl.[7] .................................................. G01R 27/00
(52) U.S. Cl. ........................ 216/59; 134/1.1; 156/345; 204/192.33; 333/99 PL; 702/65
(58) Field of Search .................................. 134/1.1, 8, 18, 134/21, 22.1; 204/192.33; 216/59, 61, 67; 333/17.3, 99 PL; 702/57, 60, 64, 65

(56) References Cited

U.S. PATENT DOCUMENTS

| | | |
|---|---|---|
| 4,345,968 | 8/1982 | Desilets et al. . |
| 4,362,596 | 12/1982 | Coe . |
| 4,605,479 | 8/1986 | Faith, Jr. . |
| 4,657,616 | 4/1987 | Benzing et al. . |
| 4,720,628 * | 1/1988 | Drake, Jr. .............................. 250/214 |
| 4,786,352 | 11/1988 | Benzing . |
| 4,960,488 | 10/1990 | Law et al. . |
| 5,089,084 | 2/1992 | Chhabra et al. . |
| 5,198,072 * | 3/1993 | Gabriel ................................. 156/627 |
| 5,198,634 | 3/1993 | Mattson et al. . |
| 5,219,791 | 6/1993 | Freiberger . |
| 5,242,532 * | 9/1993 | Cain ..................................... 156/626 |
| 5,281,302 | 1/1994 | Gabic et al. . |
| 5,284,547 | 2/1994 | Watanabe . |
| 5,308,950 | 5/1994 | Ramm et al. . |
| 5,326,723 | 7/1994 | Petro et al. . |
| 5,407,524 * | 4/1995 | Patrick et al. ....................... 156/627 |
| 5,565,038 | 10/1996 | Ashley . |
| 5,643,364 * | 7/1997 | Zhao et al. ....................... 118/723 E |
| 5,689,215 * | 11/1997 | Richardson et al. ................ 333/17.3 |
| 5,785,796 | 7/1998 | Lee . |
| 5,812,403 | 9/1998 | Fong et al. . |
| 5,837,094 | 11/1998 | Tsukazaki et al. . |

FOREIGN PATENT DOCUMENTS

| | | | |
|---|---|---|---|
| 363128718A * | 6/1988 | (JP) ............................. | H01L/21/302 |
| 06-338478 | 12/1994 | (JP) . | |

* cited by examiner

Primary Examiner—Randy Gulakowski
Assistant Examiner—Allan Olsen
(74) Attorney, Agent, or Firm—Lowe Hauptman Gilman & Berner, LLP

(57) ABSTRACT

The end of a cleaning process of a vacuum workpiece processing chamber evacuated to a constant pressure vacuum condition is controlled. The chamber is cleaned by exciting a cleaning gas to a plasma state by a field including an electric component. The process is terminated in response to detection of a substantial decrease in the time rate of change of pressure in a foreline of a vacuum pump evacuating the chamber after the plasma electrical impedance has been stabilized. The substantial decrease signals that the chamber is clean. A horn in the chamber that excites the gas to a plasma is indicated as being clean when the plasma electrical impedance is stable. The indication of plasma impedance stabilization is derived by monitoring horn DC bias voltage, or one or both variable reactances of a matching network connected between the horn and an r.f. excitation source for the horn.

21 Claims, 2 Drawing Sheets

METHOD OF AND APPARATUS FOR DETECTING AND CONTROLLING IN SITU CLEANING TIME OF VACUUM PROCESSING CHAMBERS

This application is a divisional of Application Ser. No.08/829,674 filed Mar. 31, 1997, U.S Pat. No. 6,017,414 issued Jan. 25, 2000.

FIELD OF INVENTION

The present invention relates generally to a method of and apparatus for detecting and controlling in situ cleaning of vacuum processing chambers and more particularly to such a method and apparatus wherein at least one part in such a chamber is detected as being clean by determining that a plasma derived by electrically exciting a cleaning gas has a stabilized electrical impedance.

BACKGROUND ART

One type of vacuum wafer processing chamber includes a plasma source comprising a source of gas to be converted into a plasma and an electrically driven electrode for exciting the gas into an a.c. plasma state. The gas is supplied to the chamber by an appropriate gas line, while the chamber is maintained at a vacuum by a vacuum pump connected to the chamber interior by a foreline. In one arrangement, the electrode is a horn excited by r.f. energy via a matching network. The matching network includes variable reactances having values which are controlled to obtain an impedance match between a source of the r.f. energy and a dynamic r.f. impedance seen by the horn. The r.f. dynamic impedance varies unpredictably as a function of many parameters of the r.f. plasma. A sheath exists between metal walls of the electrode and the plasma to cause the electrode to be maintained at a DC bias voltage that is also a function of the plasma parameters.

Vacuum wafer processing chambers of all types, including the type previously described, become contaminated with various byproducts of the wafer process. Typically, the contamination is so great that the chamber must be cleaned after several (e.g., five) wafers have been processed. Preferably, the chambers are cleaned in situ, without breaking the vacuum of the chamber, to minimize processing down time. Typically, the chamber is cleaned by supplying nitrogen trifluoride ($NF_3$) to the interior of the chamber via the same line that supplies the processing gas to the chamber interior. The $NF_3$ is excited to a plasma including free nitrogen and fluorine ions that etch contaminant particles from various interior parts of the chamber, particularly the horn, the chamber walls and other hardware, such as rivets and bolts. The particles are etched from the chamber parts as a result of a chemical reaction of ions in the $NF_3$ plasma with the contaminants. The particles are removed by the vacuum pump via the foreline.

While it is desirable to clean the chamber as thoroughly as possible, it is also desirable to minimize the time required for the cleaning operation. Since no wafer processing can occur while the chamber is being cleaned, minimizing the chamber cleaning time increases chamber wafer processing throughput. In addition, overcleaning the chamber has deleterious effects on the cleaned parts because the cleaned parts are etched by ions of the $NF_3$ plasma. Hence, overcleaning the chamber shortens the life of the cleaned parts. In addition, overcleaning can actually increase contamination problems because additional particulates are outgassed and sputtered into the chamber as a result of the reaction of the $NF_3$ plasma ions with the cleaned parts in the chamber interior.

Presently, an optical emission spectroscopy (OES) technique is used to determine when a vacuum wafer processing chamber is in situ cleaned by the $NF_3$ plasma ions. The OES technique requires a relatively expensive optical emission spectrometer to have a hand-held probe positioned to be responsive to optical energy emitted by the plasma and coupled through a window of the chamber. The optical emission spectrometer monitors the intensities of fluorine and nitric oxide peaks of the emitted plasma spectra resulting from the $NF_3$ cleaning process. When the intensities of the fluorine (F) and nitric oxide (NO) peaks are stabilized, the chamber interior is assumed to be clean.

However, the prior art OES technique is quite vague and subjective. Very often the intensities of the F and NO peaks never stabilize, but keep changing at a rate lower than the peak rate. In addition, localized plasma conditions that sometimes occur in the processor can cause unreliable OES results. Further, the OES spectra are affected by the location of the spectrometer probe which is frequently positioned at different points relative to the window. The different positions of the spectrometer probe result in inconsistent measurements of the fluorine and nitric oxide peaks. Because the OES technique is incapable of distinguishing between contaminant products resulting from quartz and silicon dioxide etchings, the F and NO peak intensities frequently are never completely stabilized and the results are often convoluted. A further disadvantage of the OES technique is that it requires a specialized, relatively expensive piece of equipment to determine a characteristic completely unrelated to wafer processing.

It is accordingly an object of the present invention to provide a new and improved method of and apparatus for determining when a vacuum processing chamber and/or a part therein is clean.

Another object of the present invention is to provide a new and improved method of and apparatus for controlling the end of a cleaning cycle of a vacuum processing chamber.

A further object of the present invention is to provide a new and improved method of and apparatus for determining when a vacuum processing chamber and/or a part therein is clean and/or a cleaning cycle is ended, wherein equipment and a computer program associated with workpiece processing are the only apparatus required.

An additional object of the present invention is to provide a new and improved method of and apparatus for determining when a vacuum processing chamber and/or a part therein is clean and/or ending a cleaning cycle, wherein overcleaning of the chamber parts and its attendant disadvantages is avoided.

An added object of the present invention is to provide a new and improved method of and apparatus for determining when a vacuum processing chamber and/or a part therein is clean and/or ending a cleaning cycle, wherein the end of the clean cycle is detected with relatively great precision.

THE INVENTION

One aspect of the invention relates to determining when at least one part of a vacuum workpiece processing chamber evacuated to a vacuum condition has been cleaned by a cleaning gas excited to a plasma state by an electric field. The determination is made by detecting that the plasma electric impedance has been stabilized.

An added aspect of the invention relates to an apparatus for detecting when at least one part of a vacuum workpiece processing chamber evacuated to a vacuum condition has been cleaned by a cleaning gas excited to a plasma state by an electric field. The apparatus comprises a sensor for an electric parameter associated with the plasma impedance, and a monitor responsive to the sensor for detecting that the plasma electric impedance has been stabilized.

In one embodiment wherein the plasma is excited by AC electromagnetic energy derived by an electrode in the chamber, an indication of plasma impedance stabilization is derived by monitoring electrode DC bias voltage. The plasma impedance is preferably indicated as being stabilized in response to the electrode DC bias voltage having a local peak value or a constant value for at least a predetermined time interval following a substantial increase in the time rate of change of electrode DC bias voltage.

The indication of plasma impedance stabilization can also be derived by monitoring the value of one or two variable reactances in a matching network connected between an excitation source for the electrode and the electrode. In particular, the plasma impedance is indicated as being stabilized in response to the value of the variable reactance being substantially constant for more than a predetermined interval.

Still another aspect of the invention relates to determining when at least one part of a vacuum workpiece processing chamber evacuated to a vacuum condition has been cleaned by a cleaning gas excited to a plasma state by an electric field. The determination is made by detecting that the plasma electric impedance has been stabilized.

An added aspect of the invention relates to an apparatus for detecting when at least one part of a vacuum workpiece processing chamber evacuated to a vacuum condition has been cleaned by a cleaning gas excited to a plasma state by an electric field. The apparatus comprises a sensor for an electric parameter associated with the plasma impedance, and a monitor responsive to the sensor for detecting that the plasma electric impedance has been stabilized.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
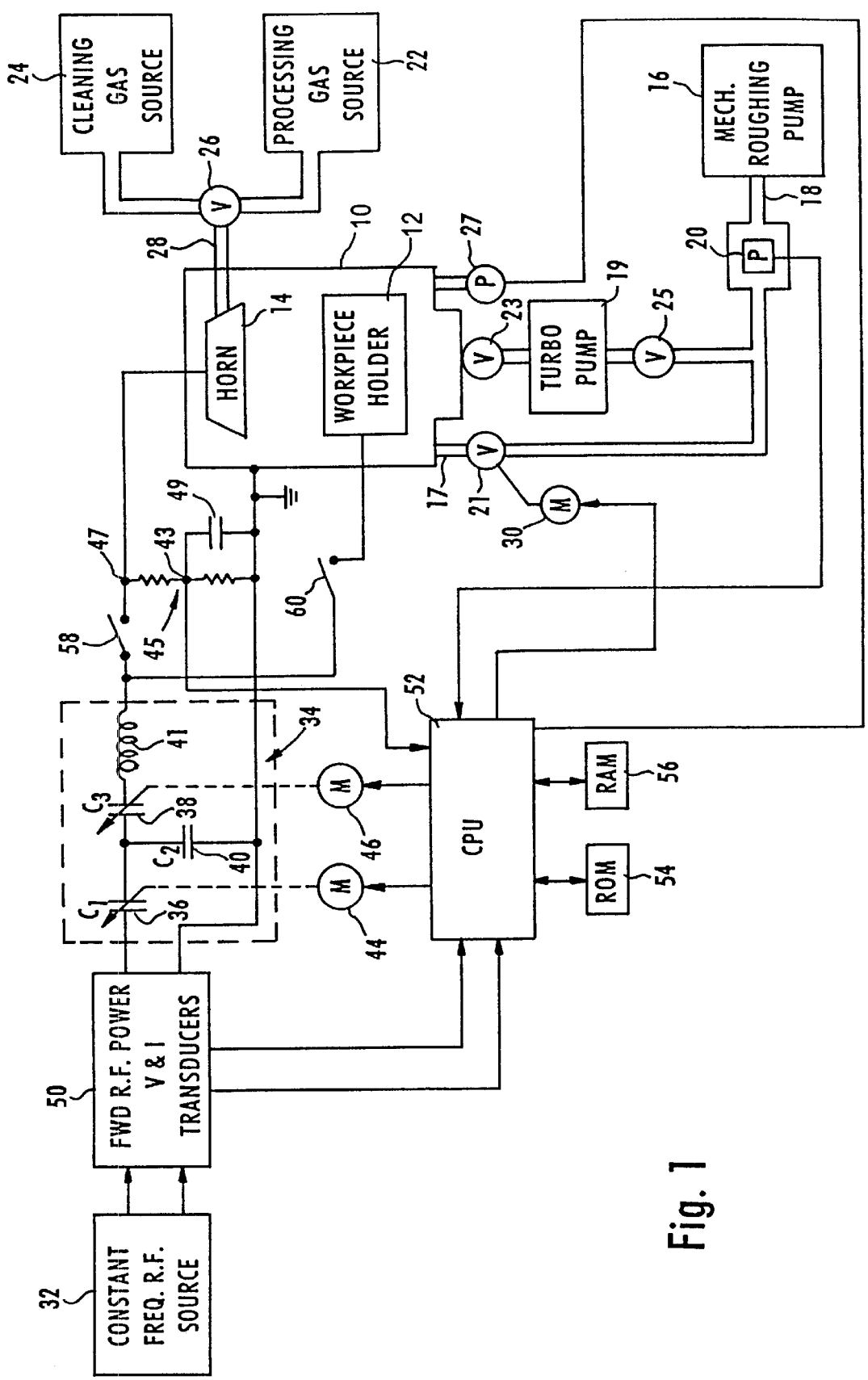
FIG. 1 is a block diagram of apparatus for cleaning a vacuum processing chamber in accordance with a preferred embodiment of the present invention.

Reference is now made to FIG. 1 of the drawing wherein vacuum processing reactor, i.e. chamber, 10 is schematically illustrated as including workpiece holder 12 and electrically excited metal horn 14 which serves as an electrode. Workpieces, usually in the form of silicon wafers used in semiconductor manufacture, are transported by a wafer transport mechanism (not shown) to workpiece holder 12. A vacuum is established in chamber 10 by connecting a pumping arrangement to the interior of the chamber by turbo port/valve 23 and line 17. During workpiece processing, chamber 10 is connected to turbo pump 19, in turn connected to mechanical roughing pump 16 via foreline 18 where pressure sensor 20 is located. Pressure sensor 20 derives an electrical signal having a value indicative of the pressure in line 18. During cleaning of chamber 10, turbo pump 19 is bypassed by closing valves 23 and 25 so foreline 18 is connected directly to chamber 10 through valve 21. During cleaning, chamber 10 is maintained at a constant set point pressure under the control of valve 21 by motor 30 in response to pressure sensed by pressure detector 27 attached to the chamber. Since the pressure in chamber 10 is constant during cleaning, the signal derived by sensor 20 at that time is a function of the flow rate of cleaned particles evacuated from the chamber.

Processing gas source 22 and cleaning gas source 24 are selectively connected to the interior of chamber 10 by valve arrangement 26 and gas line 28 that supplies the gas to the chamber via jets (not shown) in horn 14. Valve arrangement 26 is pneumatically controlled so gas from source 22 is selectively supplied to the interior of chamber 10, or gas from source 24 is selectively supplied to the interior of the chamber, or neither of sources 22 nor 24 is connected to the chamber interior. Typically, the cleaning gas in source 24 is nitrogen trifluoride ($NF_3$). Source 22 supplies any conventional processing gas (e.g. $SiH_4$ or $SiF_4$) or a plurality of processing gases to chamber 10. The processing gases are simultaneously or sequentially and selectively connected through valve arrangement 26 to gas line 28.

During wafer processing, microwave energy at 2.45 GHz is coupled from a suitable source through a microwave window (not shown) to excite the gas from source 22 to a plasma. Electron cyclotron resonance is achieved from the combination of microwave power and an applied magnetic field from a DC electromagnet (not shown). During cleaning and processing, horn 14 and/or other electrodes, e.g. an electrostatic chuck or a target (not shown) in chamber 10 is energized with r.f. energy, typically 13.56 MHz, derived from constant frequency r.f. source 32. The r.f. energy derived from source 32 is coupled to horn 14 via closed contacts of relay 58 and matching network 34, configured as a "T" network including series variable capacitors 36 and 38 (capacitors $C_1$ and $C_3$, respectively), shunt capacitor 40 (capacitor $C_2$) and fixed inductor 41. If an electrode on workpiece holder 12 is powered, the contacts of relay 58 open and the contacts of relay 60 are closed so the r.f. from source 38 is supplied to the electrode of the workpiece holder.

The processing gas plasma etches material from and/or deposits material onto the workpiece on holder 12. The cleaning gas is converted into a plasma in response to the r.f. electromagnetic field from horn 14 to etch all exposed metal and quartz surfaces in the interior of chamber 10. The resulting etched particles which are produced both during processing and cleaning, are withdrawn from chamber 10 by vacuum pump 16 through foreline 18.

A sheath between the plasma and horn 14 causes a variable DC bias voltage to be established between the horn and plasma. The value of the horn DC bias voltage is monitored at tap 43 of resistive voltage divider 45 connected in shunt with terminal 47 between inductor 41 and horn 14. A percentage of the voltage at terminal 47 is averaged at tap 43 since the tap is shunted by capacitor 49 which serves as a lowpass filter.

The capacitance values of capacitors 36 and 38 are respectively controlled by DC motors 44 and 46. To assist in controlling the values of capacitors 36 and 38, voltage and current transducers 50 for forward r.f. power are connected between r.f. source 32 and matching network 34. Voltage and current transducers 50 derive DC signals indicative of the voltage and current supplied by source 32 to matching network 34.

The plasma in chamber 10 resulting from introduction of gas from processing gas source 22 or from cleaning gas source 24 has dynamic electrical impedance characteristics. During both the processing and cleaning operations, it is preferable to maintain an approximate 50 ohm impedance match between source 32 and the load it drives, i.e., horn 14 and the horn load, typically the plasma in chamber 10. When r.f. source 32 is matched to its load, the output impedance of source 32 is approximately equal to the impedance seen by the source and the current and voltage for forward r.f. power are in phase. To these ends, motors 44 and 46 drive capacitors 36 and 38 until the voltage and current sensed by transducers 50 are approximately in phase and a set point for the power supplied by source 32 to the load in chamber 10 is attained.

To these ends, central processing unit (CPU) 52 is controlled by a program of a type known to those skilled in the art and stored in read only memory (ROM) 54. Values of voltage and current derived from transducers 50 are coupled to CPU 52 and supplied by the CPU to random access memory (RAM) 56. CPU 52 responds to the program stored in ROM 54 and the data values stored in RAM 56 responsive to the output signals of transducers 50 to control motors 44 and 46 and therefore the values of capacitors 36 and 38 to maintain a substantially matched condition between the 50 ohm output impedance of source 32 and the impedance the source sees; the CPU also responds to an indication of the power derived by source 32 and an indication of reflected power to control motors 44 and 46 to achieve a power set point for chamber 10; an operator loads the power set point into RAM 56.

All of the structure described in connection with FIG. 1, to this point, is known.

Figure 2:
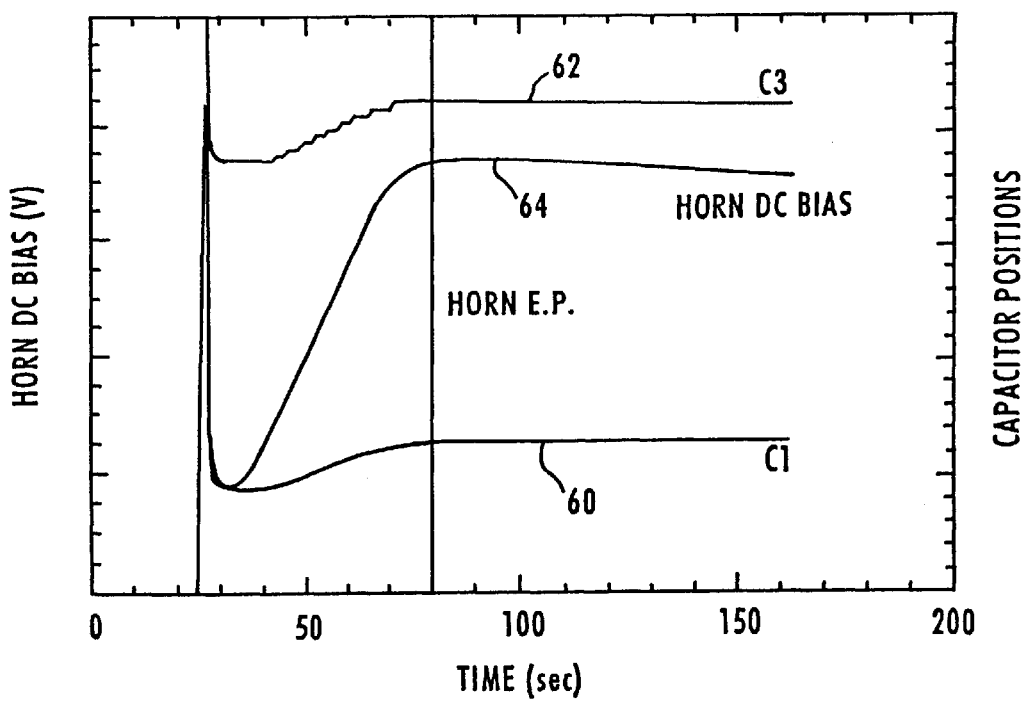
FIGS. 2 an 3 are plots of horn DC bias voltage, matching network capacitance values and foreline pressure vs. time when the apparatus of FIG. 1 is used for cleaning the vacuum processing chamber.
Figure 3:
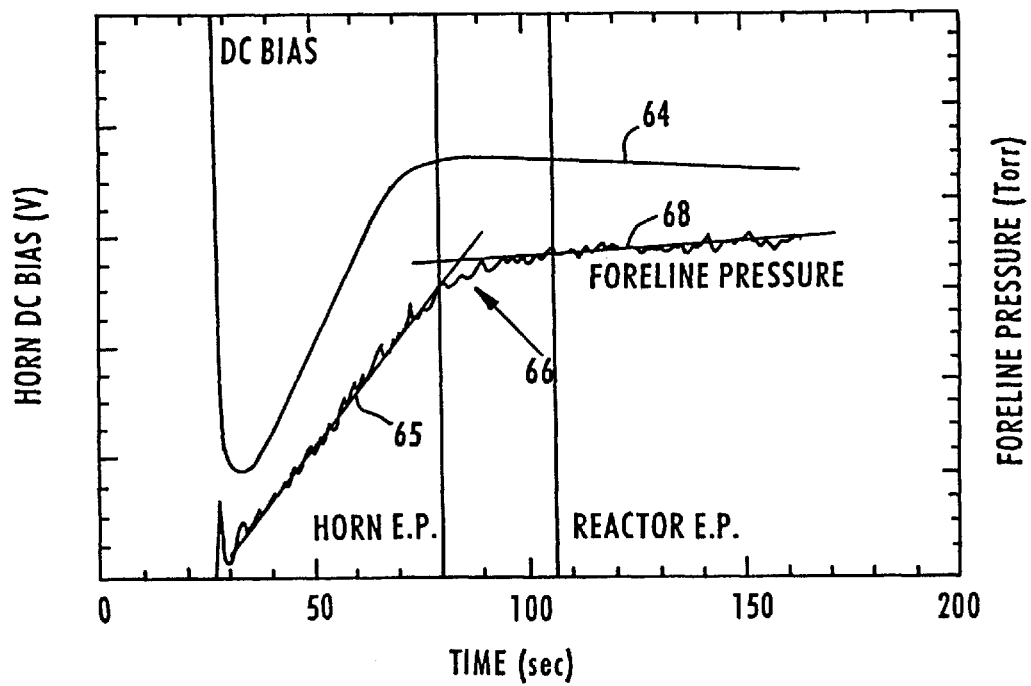

In accordance with the illustrative embodiment of FIGS. 2 and 3, chamber 10 is considered to be clean after at least one of the electrical parameters associated with the plasma impedance has been stabilized and the foreline pressure sensed by sensor 20 has been stabilized. The foreline pressure is considered to be stabilized when its time rate of change decreases substantially or remains substantially constant. The plasma impedance is considered to be stabilized when the value of at least one of capacitors 36 and 38 or the filtered DC bias voltage at tap 43 has stabilized.

The values of capacitors 36 and 38 are considered to be stabilized when the capacitances thereof are relatively constant (e.g. have a value which does not change by more than about ±2%) for a predetermined interval, e.g. five seconds. The bias voltage is considered to be stabilized when it (1) reaches a local maximum after having a substantial positive time rate of change in excess of about 1 volt per second or (2) has a constant value for more than a predetermined interval, e.g. five seconds, after having such a positive time rate of change. ROM 54 includes a segment for controlling CPU 52 to enable the CPU to determine when such stabilization has been achieved.

In response to CPU 52 responding to the values in RAM 56 and indicating the electrical parameters have been stabilized, the CPU is programmed in response to signals from ROM 54 to detect when the pressure sensed by foreline sensor 20 is stabilized. In response to CPU 52 detecting that the foreline pressure is stabilized after it detects stabilization of the electrical parameters, the CPU derives a signal to close valve 26 and stop the flow of cleaning gas from source 24 into chamber 10 via gas line 28 and turns off r.f. power source 32.

To provide a better understanding of how the program stored in ROM 54 controls CPU 52 to achieve the foregoing results, reference is now made to FIGS. 2 and 3 of the drawing. In both FIGS. 2 and 3, time is plotted along the X axis, in seconds, while the lowpass filtered horn bias voltage at tap 43 is plotted along the Y axis in volts. In FIG. 2, the variations of capacitors 36 and 38 are respectively indicated by plots 60 and 62, while the variation of the horn DC bias voltage at tap 43 is indicated in both FIGS. 2 and 3 by plot 64.

After five wafers have been processed a clean cycle is initiated by bypassing turbo pump 19 and then connecting cleaning source 24 to chamber 10, while decoupling r.f. source 32 from all electrodes in the chamber and cutting off the microwave source. As a result, there is a substantial increase in chamber pressure. After chamber pressure stabilizes at its set point controlled by motorized valve 21, the cleaning gas is excited to a plasma by coupling source 32 to horn 14, which usually occurs a little less than half a minute after source 24 was connected to the chamber. Then the horn bias voltage and values of capacitors 36 and 38 begin to change in response to the dynamic plasma impedance.

As illustrated by plots 60 and 62 in FIG. 2, the values of capacitors 36 and 38 remain relatively constant (are stabilized) after 80 seconds of cleaning time has elapsed, i.e., 80 seconds after CPU 52 effectively activated valve 26 to cause $NF_3$ from cleaning gas source 24 to be introduced into chamber 10 through gas line 28. The horn DC bias voltage, indicated by plot 64, goes through a minimum approximately 30 seconds into the cleaning cycle. Then the horn bias voltage increases to a local peak value about 80 seconds into the cleaning cycle. The horn bias voltage then decreases very gradually or remains constant. The stabilized constant capacitance values of plots 60 and 62 and the local peak of plot 64 are detected by CPU 52 in response to the program of ROM 54 by using known techniques.

It has been visually observed that horn 14, workpiece holder 12, and gas injection screws on horn 14 associated with gas line 28 are clean when any one of plots 60, 62 or 64 is stabilized, as occurs in FIG. 2 at a cleaning cycle time of 80 seconds. Hence, the stabilized condition indicated in FIG. 2 at about the 80 second cleaning cycle time is sometimes referred to as the "horn clean endpoint."

We have also observed that the pressure in foreline 18, as detected by sensor 20, increases substantially monotonically at a relatively rapid rate, e.g. at about 0.001 Torr/sec., during the first 80 seconds of the cleaning cycle, as indicated by segment 65 of foreline pressure plot 66, FIG. 3. Shortly after the "horn clean endpoint" has occurred, the rate of change of foreline pressure detected by sensor 20 decreases considerably, e.g. to about 0.00007 Torr/sec., as indicated by segment 68 of foreline pressure plot 66. In general, the decrease in the time rate of change of foreline pressure is associated with a substantial change in the flow rate of cleaned particles from chamber 10, to indicate the chamber clean end point has occurred. The resulting decrease in the slope of plot 68 from segment 65 to segment 68 provides an indication that chamber 10 is clean and valve 26 is to be closed to stop the cleaning process. The decrease in slope of segment 68 in plot 66, FIG. 3, is detected by CPU 52 using conventional techniques in response to the signal derived by sensor 20 at a time approximately 100 seconds into the cleaning cycle. The pressure in foreline 18 detected by sensor 20 increases slightly along segment 68 after the "horn clean endpoint" occurs at 80 seconds because parts within chamber 10 other than horn 14 are still being cleaned. It takes longer to clean the other parts in chamber 10 than it takes to clean horn 14 because electric power is not applied to these other parts.

It is observed from FIG. 3 that the rate of increase of the foreline pressure decreases sharply when chamber 10 is clean, but that the pressure in foreline 18 still increases slightly after cleaning has been completed. This is because the $NF_3$ cleaning gas of source 24 is still etching the walls of chamber 10 and quartz hardware associated with the electron cyclotron resonance source, even though the chamber is clean; etching of the clean chamber is at a lower rate than etching of a "dirty" chamber. We have found it is generally desirable to extend the duration of the clean cycle during which gas from source 24 is introduced into chamber 10 for about 20–30 seconds after the reactor clean endpoint has been detected; hence in the example of FIG. 3, the cleaning time is extended from approximately 100 seconds into the clean cycle to about 130 seconds. This assures complete cleaning of workpiece holder 12 and the gas injection jet screws associated with introduction of gas through gas line 28. This added 30 seconds results in a cleaning time that is still considerably shorter than cleaning times using the prior art OES technique.

It is important to prevent overcleaning of chamber 10 because overcleaning causes overetching which results in outgassing and sputtering of a considerable number of additional particles to increase the possibility of contamination of the remainder of the chamber, as well as the foreline and vacuum pump. The additional particles are etched from the walls of chamber 10 and the components in the chamber. Hence, preventing overcleaning also lengthens the life of chamber 10 and the components included in it.

The present invention has the further advantage of not requiring any additional components. It is only necessary to modify the program of ROM 54 to control valve 26 and the output of r.f. source 32 in response to signals from sensor 20 and the stabilized value of the DC bias voltage at tap 43 or the stabilized value of one of capacitors 36 and 38.

It has been found that detection of chamber clean endpoint by using the techniques and apparatus described in connection with FIGS. 1–3 provides consistent cleaning results and that the results are easily analyzed. Because of the substantial decrease in time required to clean processor 10 by using the techniques described in connection with FIGS. 2 and 3, there is a substantial improvement in wafer processing throughput time; in one actual configuration, there was an approximately 30% improvement in throughput time. In addition, the techniques described in connection with FIGS. 2 and 3 enable the chamber clean endpoint to be more easily and reliably detected than with the prior art arrangement; because of the improved reliability of the chamber clean endpoint detection, the cleaning time is also decreased relative to the prior art.

Actual measurements made with the cleaning system operating in accordance with FIGS. 2 and 3 wherein a cleaning cycle was executed each time five silicon wafers were processed in two 3,000 (8 inch) wafer extended runs, reveal that less than 0.05 particles per square centimeter were added for a silicon dioxide deposition run and for a fluorine doped silicon dioxide run. Because overcleaning is minimized by using the techniques described in connection with FIGS. 2 and 3, excessive etching of the walls of chamber 10 and quartz and other components included in the chamber is minimized, to maximize component lifetime. Measurements also reveal the lifetime of quartz and/or other consumable components in the chamber is increased to 5,000 wafers. Further, by monitoring the values of capacitors 36 and 38, the bias voltage of horn 14 and the pressure in foreline 18, CPU 52 is able to compile and store data in RAM 56 which can be used as a diagnostic tool for the cleaning performance of gas from source 24 and the operating condition of the processor including chamber 10.

While there has been described and illustrated one specific embodiment of the invention, it will be clear that variations in the details of the embodiment specifically illustrated and described may be made without departing from the true spirit and scope of the invention as defined in the appended claims. For example, the process can be performed by monitoring only the value of one of capacitor 36, capacitor 38 or of the bias voltage at tap 43. Also the technique can be used with electrical impedances other than horn 14 for exciting a cleaning gas to a plasma, e.g. a capacitively coupled plasma, an inductively coupled plasma or a microwave excitation plasma. In addition, it is not necessary to monitor an electrical parameter before detecting the change in slope in the pressure detected by sensor 20. In fact, the invention can be used with vacuum processors that do not employ plasmas. However, more reliable results are usually obtained by detecting that an electrical parameter is stable before beginning the detection process for the foreline pressure slope change. The process can also be performed manually.

We claim:

1. A method of detecting when an electrode supplying AC energy to a plasma of a vacuum workpiece processing chamber evacuated to a vacuum condition has been cleaned by a cleaning gas excited by the electrode to the plasma, the electrode being in the chamber, the method comprising detecting that the plasma electric impedance has been stabilized by monitoring the electrode DC bias voltage, and signaling that the electrode is clean in response to the monitored electrode DC bias voltage having a predetermined condition.

2. The method of claim 1 wherein the predetermined condition is the electrode DC bias voltage having a local peak value.

3. The method of claim 1 further including averaging the DC bias voltage, and performing the signaling step in response to the averaged DC bias voltage having the predetermined condition after having a positive time rate of change in excess of a predetermined value.

4. The method of claim 3 wherein the predetermined condition is a local peak value.

5. The method of claim 3 wherein the predetermined condition is a constant value for at least a predetermined duration.

6. The method of claim 5 wherein the predetermined duration is 5 seconds.

7. The method of claim 6 wherein the positive time rate of change is about 1 volt per second.

8. The method of claim 6 wherein the positive time rate of change is about 1 volt per second.

9. A method of detecting when at least one part of a vacuum workpiece processing chamber evacuated to a vacuum condition has been cleaned by a cleaning gas excited to a plasma state by AC energy supplied to a plasma excitation impedance by a matching network including a variable reactance that is adjusted until an impedance match between an AC plasma excitation source driving the excitation impedance and the plasma has been achieved, the method comprising detecting that the plasma electric impedance has been stabilized by detecting the value of the variable reactance, and signaling that the part is clean in response to the detected value of the variable reactance being constant for at least a predetermined time interval.

10. The method of claim 9 wherein the cleaned part is an electrode included in the plasma excitation impedance, the electrode being connected via the matching network to be responsive to the AC energy.

11. The method of claim 9 wherein the predetermined time interval is about 5 seconds.

12. The method of claim 9 wherein the matching network includes plural variable reactances that are adjusted until the impedance match has been achieved, and performing the signaling step only in response to the detected values of all the plural variable reactances being simultaneously substantially constant for at least the predetermined time interval.

13. The method of claim 12 wherein the variable reactances are constant within ±2% for about 5 seconds.

14. A vacuum plasma processor comprising a vacuum plasma processing chamber adapted to operate under vacuum conditions and to be responsive to a cleaning gas in the chamber, a detector for a stable condition of the plasma electric impedance, the detector including a monitor for the electrode DC bias voltage, the detector being arranged for signaling that the electrode has been cleaned by the cleaning gas in response to the monitored electrode DC bias voltage having a predetermined condition.

15. The processor of claim 14 wherein the predetermined condition is the electrode DC bias voltage having a local peak value.

16. The processor of claim 14 wherein the detector includes an arrangement for averaging the electrode DC bias and for signaling that the electrode has been cleaned in response to the averaged DC bias voltage having the predetermined condition after having a positive time rate of change in excess of a predetermined value.

17. A vacuum plasma processor comprising a vacuum plasma processing chamber, an AC plasma excitation source, an electric impedance for supplying AC energy to a plasma chamber, a matching network connected between the AC plasma excitation source and the electric impedance, the matching network including a variable reactance, a sensor for a matched condition between the AC source and the electric impedance and its load, a controller responsive to the sensor for adjusting the variable reactance to achieve an impedance match between the AC source and the electric impedance and its load, a detector for a stable condition of the plasma electric impedance, the detector being arranged for signaling that at least one part in the chamber has been cleaned by the cleaning gas in response to the value of the variable reactance being constant for at least a predetermined time interval.

18. The processor of claim 17 wherein the matching network includes plural variable reactances that are adjusted until the impedance match has been achieved, the detector being arranged for signaling that at least one part has been cleaned only in response to the detected values of all the plural variable reactances being simultaneously substantially constant for at least the predetermined time interval.

19. The processor of claim 18 wherein the predetermined time interval is about 5 seconds.

20. The processor of claim 2 wherein the variable reactances are constant within ±2% for about 5 seconds.

21. The processor of claim 18 wherein the cleaned part is an electrode included in the plasma excitation impedance, the electrode being connected via the matching network to be responsive to the AC energy.

* * * * *